(12) United States Patent
Liaw (10) Patent No.: US 7,292,467 B2
(45) Date of Patent: Nov. 6, 2007

(54) MAGNETIC RANDOM ACCESS MEMORY DEVICE

(75) Inventor: Jhon Jhy Liaw, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/907,978

(22) Filed: Apr. 22, 2005

(65) Prior Publication Data

US 2006/0239066 A1     Oct. 26, 2006

(51) Int. Cl.
*G11C 11/00* (2006.01)
(52) U.S. Cl. .................. 365/158; 365/210; 365/196
(58) Field of Classification Search ............. 365/158, 365/210, 196
See application file for complete search history.

(56) References Cited

U.S. PATENT DOCUMENTS

| | | | |
|---|---|---|---|
| 6,055,178 A * | 4/2000 | Naji | 365/158 |
| 6,341,084 B2 * | 1/2002 | Numata et al. | 365/158 |
| 6,466,471 B1 | 10/2002 | Bhattacharyya | |
| 6,480,365 B1 * | 11/2002 | Gill et al. | 360/324.11 |
| 6,549,455 B2 * | 4/2003 | Yamada | 365/158 |
| 6,711,053 B1 | 3/2004 | Tang | |
| 6,778,433 B1 | 8/2004 | Tang | |
| 6,781,874 B2 * | 8/2004 | Hidaka | 365/171 |
| 6,801,450 B2 | 10/2004 | Perner | |
| 6,985,383 B2 * | 1/2006 | Tang et al. | 365/171 |
| 7,057,922 B2 * | 6/2006 | Fukumoto | 365/158 |
| 2005/0047204 A1 * | 3/2005 | Johnson | 365/158 |
| 2005/0127403 A1 * | 6/2005 | Hsu | 257/200 |
| 2005/0169047 A1 * | 8/2005 | Johnson | 365/158 |
| 2006/0039183 A1 * | 2/2006 | Lin et al. | 365/158 |
| 2006/0104136 A1 * | 5/2006 | Gogl et al. | 365/207 |

* cited by examiner

Primary Examiner—Thong Q. Le
(74) Attorney, Agent, or Firm—Baker & McKenzie LLP (57) ABSTRACT

A memory device includes a memory cell, a reference structure, and a sensing device. The memory cell includes an MR element and a pass transistor. The pass transistor, reference structure, and sensing device are connected to an input node. The logic state of the memory cell can be detected by a read operation that includes the sensing device sensing the voltage at the input node. The voltage at the input node will vary depending on the state of the MR element. The reference structure provides a voltage drop allowing for an increased read voltage to the memory cell. This in turn can provide for decreased read times. In some embodiments, the MR element can include a magnetic tunneling junction sandwiched between electrode layers. One of the electrode layers can be connected to a bit line, the other can be connected to the pass transistor.

18 Claims, 7 Drawing Sheets

MAGNETIC RANDOM ACCESS MEMORY DEVICE

TECHNICAL FIELD

This invention relates to random access memory devices that include magnetoresistive memory elements.

BACKGROUND

Figure 1:
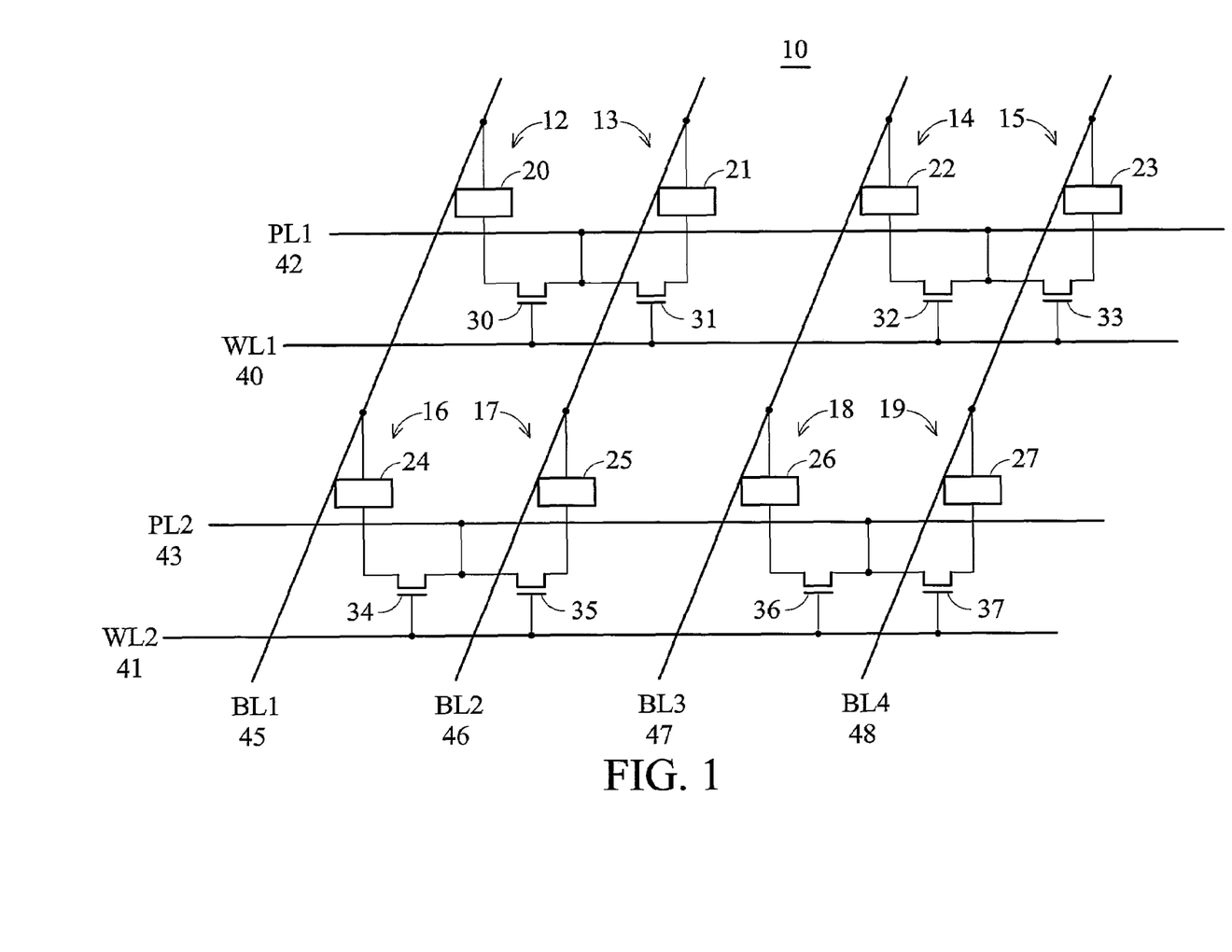
FIG. 1 shows a schematic diagram of a portion of an MRAM array.

Magnetic random access memory (MRAM) is a non-volatile memory that uses magnetism rather than electrical power to store data. FIG. 1 shows a schematic diagram of a portion 10 of an MRAM array, which includes a plurality of memory cells 12-19. Each memory cell 12-19 includes a magnetoresistive (MR) element 20-27 and a transistor 30-37. The transistors 30-33 are coupled to each other via a word line (WL1) 40, and transistors 34-37 are coupled to each other via a word line (WL2) 41, where the word lines 40, 41 form the gate electrode for the transistors 30-37. The transistors 30-33 are also coupled to each other via a program line (PL1) 42, and transistors 34-37 are coupled via a program line (PL2) 43, where the program lines 42, 43 serve as virtual ground lines. Similarly, the MR elements 20 and 24 are coupled to each other by bit line (BL1) 45, MR elements 21 and 25 are coupled to each other by bit line (BL2) 46, MR elements 22 and 26 are coupled to each other by bit line (BL3) 47, and MR elements 23 and 27 are coupled to each other by bit line (BL4) 48. The bit lines 45-48 are typically somewhat perpendicular to the word lines 40, 41 and the program lines 42, 43.

Figure 2:
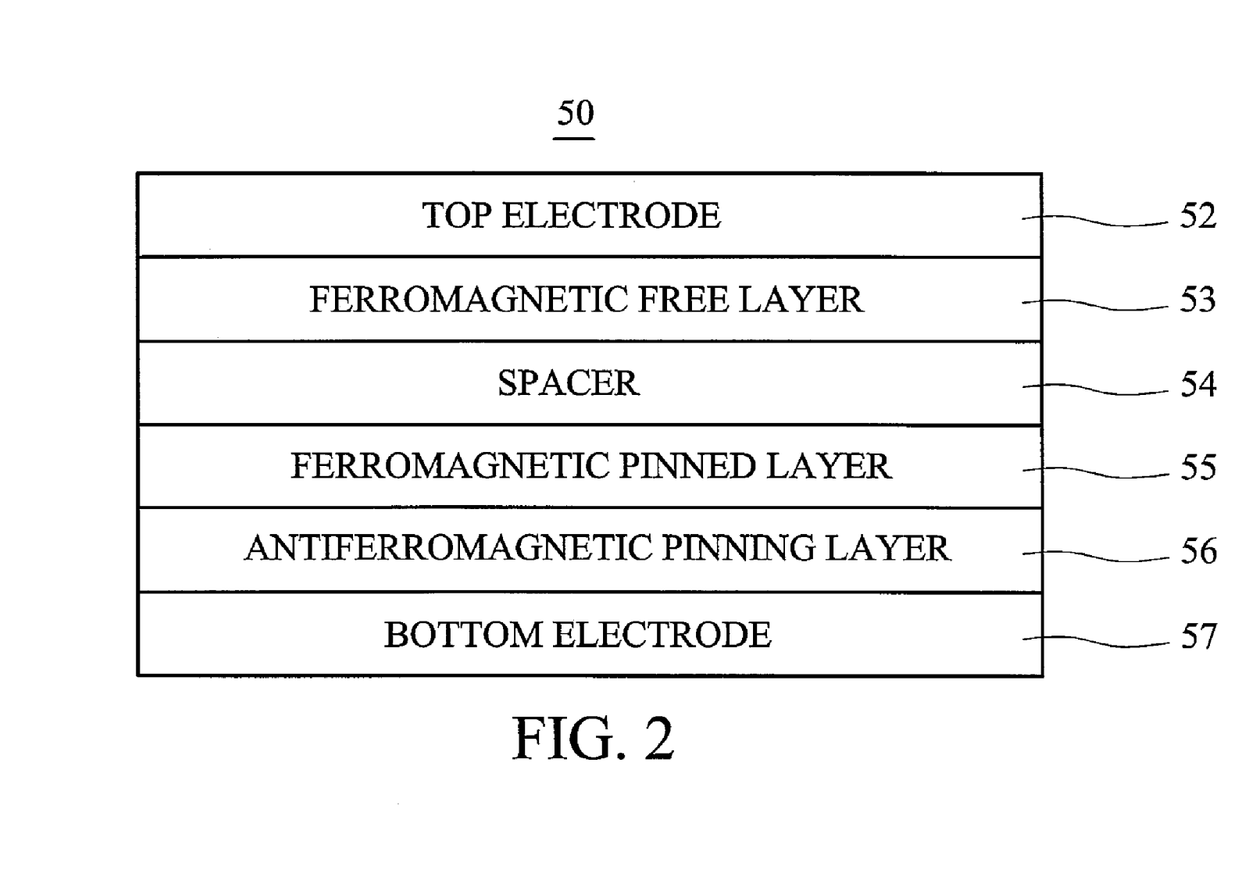
FIG. 2 shows a schematic block diagram of a typical MTJ structure.

Each of the MR elements 20-27 is a multi-layer magnetoresistive element, such as a magnetic tunneling junction (MTJ) or a giant magnetoresistive (GMR) element. FIG. 2 shows an example of a typical MTJ element 50. The MTJ element 50 includes four basic layers: a free layer 52, a spacer 54 which serves as a tunneling barrier, a pinned layer 56, and a pinning layer 58. The free layer 52 and the pinned layer 56 are constructed of ferromagnetic material, for example cobalt-iron or nickel-cobalt-iron. The pinning layer 58 is constructed of antiferromagnetic material, for example platinum manganese. Magnetostatic coupling between the pinned layer 56 and the pinning layer 58 causes the pinned layer 56 to have a fixed magnetic moment. The free layer 52, on the other hand, has a magnetic moment that, by application of a magnetic field, can be switched between a first orientation, which is parallel to the magnetic moment of the pinned layer 56, and a second orientation, which is antiparallel to the magnetic moment of the pinned layer 56.

The spacer 54 interposes the pinned layer 56 and the free layer 52. The spacer 54 is composed of insulating material, for example aluminum oxide, magnesium oxide, or tantalum oxide. The spacer 54 is formed thin enough to allow the transfer (tunneling) of spin-aligned electrons when the magnetic moments of the free layer 52 and the pinned layer 56 are parallel. On the other hand, when the magnetic moments of the free layer 52 and the pinned layer 56 are antiparallel, the probability of electrons tunneling through the spacer 54 is reduced. This phenomenon is commonly referred to as spin-dependent tunneling (SDT).

Figure 3:
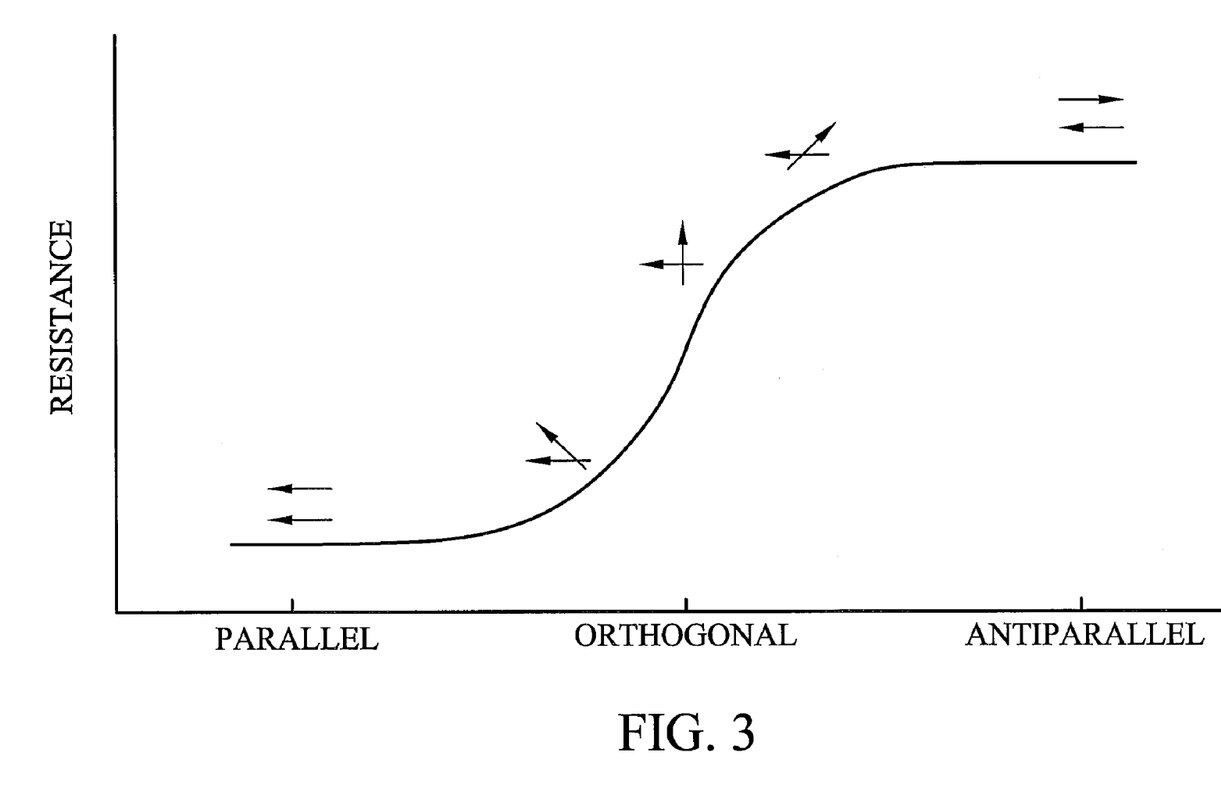
FIG. 3 shows a graph of the relationship between resistance and the relative magnetic orientations of the free and pinned layers in the MTJ shown in FIG. 2.

As shown in FIG. 3, the electrical resistance through the MTJ 50 (e.g., through layers 52-58) increases as the moments of the pinned and free layers become more antiparallel and decreases as they become more parallel. In an MRAM memory cell, the electrical resistance of the MTJ 50 can therefore be switched between first and second resistance values representing first and second logic states. For example, a high resistance value can represent a logic state "1" and a low resistance value can represent a logic state "0". The logic states thus stored in the memory cells can be read by passing a sense current through the MR element and sensing the resistance. For example, referring back to FIG. 1, the logic state of memory cell 12 can be read by passing a sense current through bit line (BL1) 45, activating transistor 30 via word line (WL1) 40, and sensing the current passing to program line (PL1) 42.

During a write operation, electrical current flows through a program line 42, 43 and a bit line 45-48 that intersect at the target memory cell 12-19. For example, in order to write to memory cell 13, a current is passed through program line (PL1) 42 and a current is passed through bit line (BL2) 46. The magnitude of these currents is selected such that, ideally, the resulting magnetic fields are not strong enough on their own to affect the memory state of the MR elements 20-23 and 25, but the combination of the two magnetic fields (at MR element 21) is sufficient for switching the memory state (e.g., switching the magnetic moment of the free layer 52) of the MR element 21.

SUMMARY

In a memory cell such as those shown in FIG. 1, the difference (read margin) between a current representative of logic state "1" and another current representative of logic state "0" depends directly on the magnetoresistive ratio (MR ratio) of the MR element. Thus, in such memory cells a high MR ratio is desired in order to be able to discern the difference between the to logic states. The MR ratio of an MR element varies according to applied voltage, for example as the applied voltage increases, the MR ratio decreases. Thus, since a high MR ratio is usually necessary for MRAM operation, it is necessary to keep the applied voltage relatively low so that the MR ratio does not drop to a point where the memory cell is unreadable. However, this limits access speed since a higher access speed requires a higher voltage.

Disclosed herein is an improved magnetoresistive memory device that includes a reference circuit that allows for increased voltage levels for read operations. The magnetoresistive memory device also includes a memory cell that has an MR element and a pass transistor. In some embodiments, the MR element can include a magnetic tunneling junction sandwiched between upper and lower electrode layers. The upper electrode layer can be connected to a conductive bit line. The lower electrode layer can be connected to the drain of the pass transistor. The source of the pass transistor is connected to an input node, which is also connected to the reference circuit and a sense amplifier.

The reference circuit can include a reference transistor. The drain of the reference transistor can be connected to the source of the pass transistor. In some embodiments, connection between the reference transistor of the reference circuit and the pass transistor of a memory cell can be controlled via a column-selector transistor connected between the pass transistor and the reference transistor. Instead of passing a portion of a read current through an MR element and sensing the remaining read current as is done in prior memory cells, the present memory device uses a sensing device to sense the voltage level at an input node between the memory cell and the reference circuit.

BRIEF DESCRIPTION OF THE DRAWINGS

Embodiments are illustrated by way of example in the accompanying figures, in which like reference numbers indicate similar parts, and in which.

DETAILED DESCRIPTION

Figure 4:
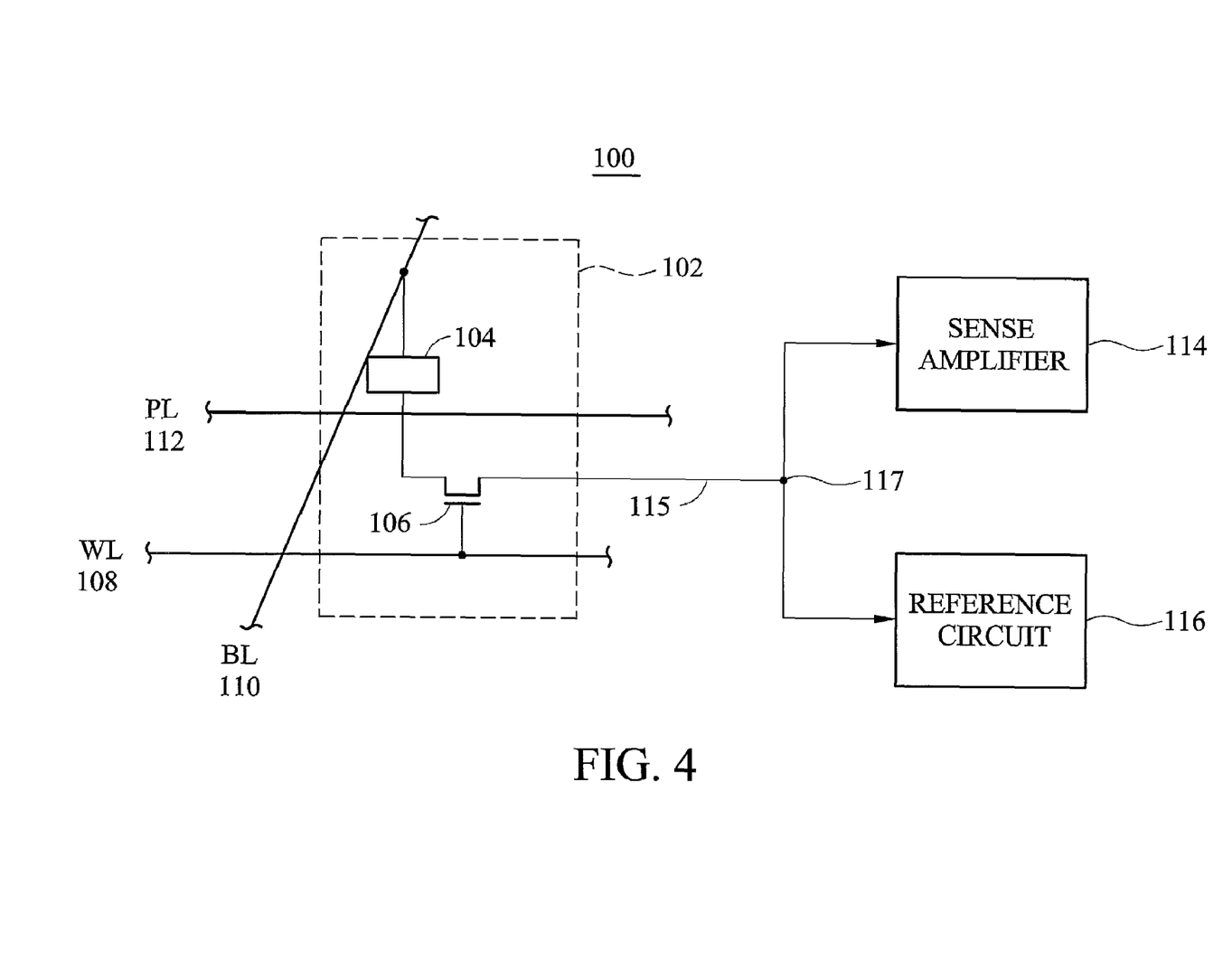
FIG. 4 shows a schematic diagram of a portion of an MRAM array.

FIG. 4 shows a schematic diagram of a portion of an MRAM array 100, which includes a memory cell 102. The memory cell 102 includes a magnetoresistive (MR) element 104 and a pass transistor 106. The MR element 104 can include a magnetic tunneling junction, for example including layers 52-57 shown in FIG. 2 and described above. The pass transistor 106 can be a MOS device, for example an NMOS transistor.

The MR element 104 is coupled, for example via an upper electrode layer (52 in FIG. 2) to a bit line 110. The MR element 104 is also coupled, for example via a lower electrode (57 in FIG. 2), to a drain node of the pass transistor 106. The pass transistor 106 also has a gate node that is coupled to a word line (WL) 108, and a source node that is coupled to both a sense amplifier 114 and a reference circuit 116 via a sense line 115 and an input node 117.

The sense amplifier 114 serves as a sensing device for detecting a voltage level at the input node 117 during a read operation. The sense amplifier 114 includes circuitry for comparing a voltage at node 117 to a reference voltage. In some embodiments, the reference voltage can be received from an optional reference cell (not shown). The reference cell can be similar in structure to the memory cell 102, but having an MR element or other type of resistive element that is fixed at a midpoint resistance level. The reference cell is thus fixed to output a predictable voltage level that is between the two voltage levels that could be expected to be output from the memory cell 102. The sense amplifier 114 can include circuitry for determining the logic state of the memory cell 102 based on whether the voltage at input node 117 is higher or lower than the reference voltage. Note that alternative embodiments can include providing the reference voltage from any voltage source.

A program line (PL) 112 extends in the vicinity of the MR element 104 for write operations. For example, in some embodiments a dielectric layer (not shown) can be interposed between the program line (PL) 112 and a bottom electrode layer (57 in FIG. 2) of the MR element 104. Other arrangements can be used.

Figure 5:
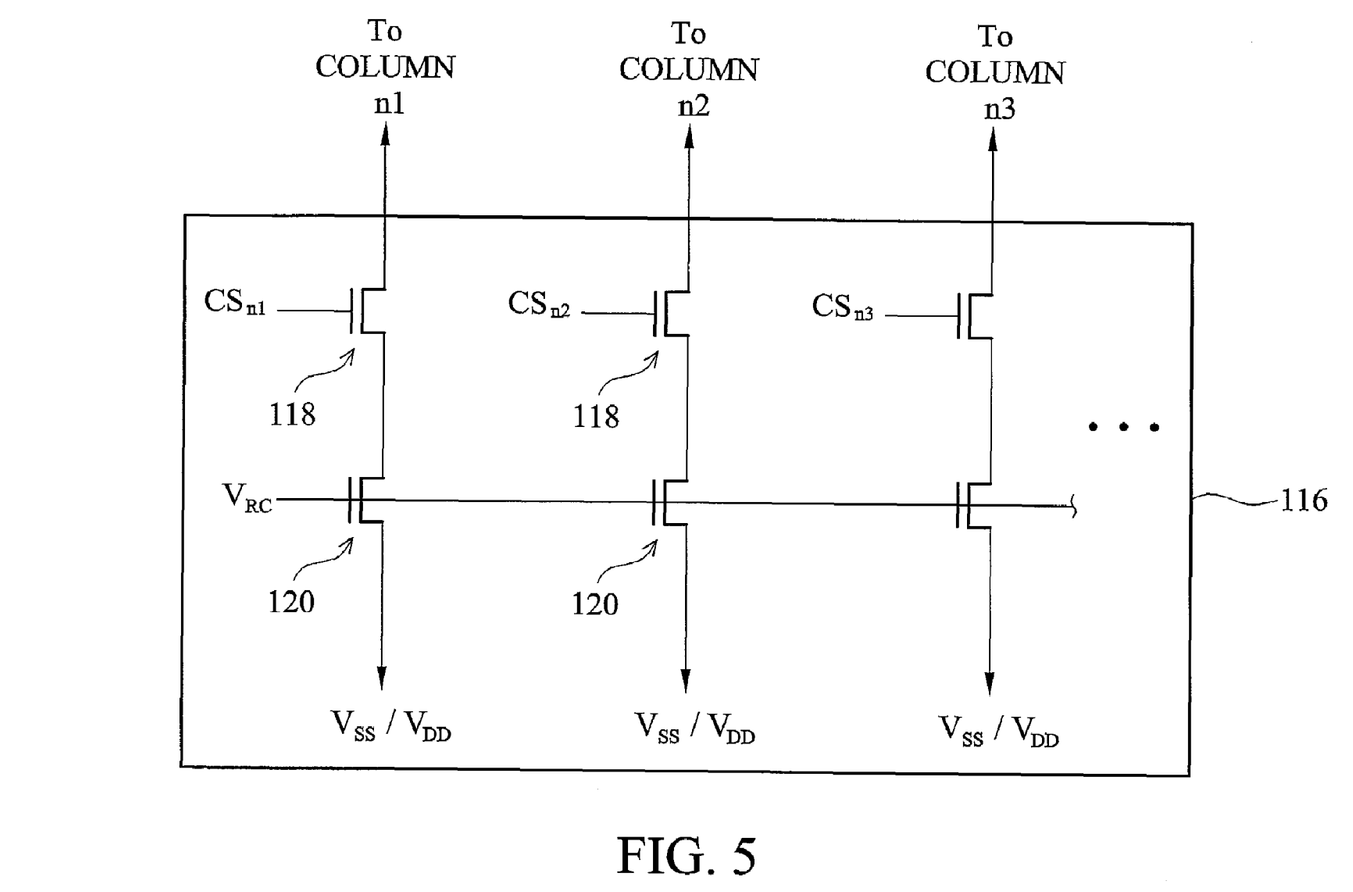
FIG. 5 shows a schematic diagram of an example of a reference circuit.
Figure 6:
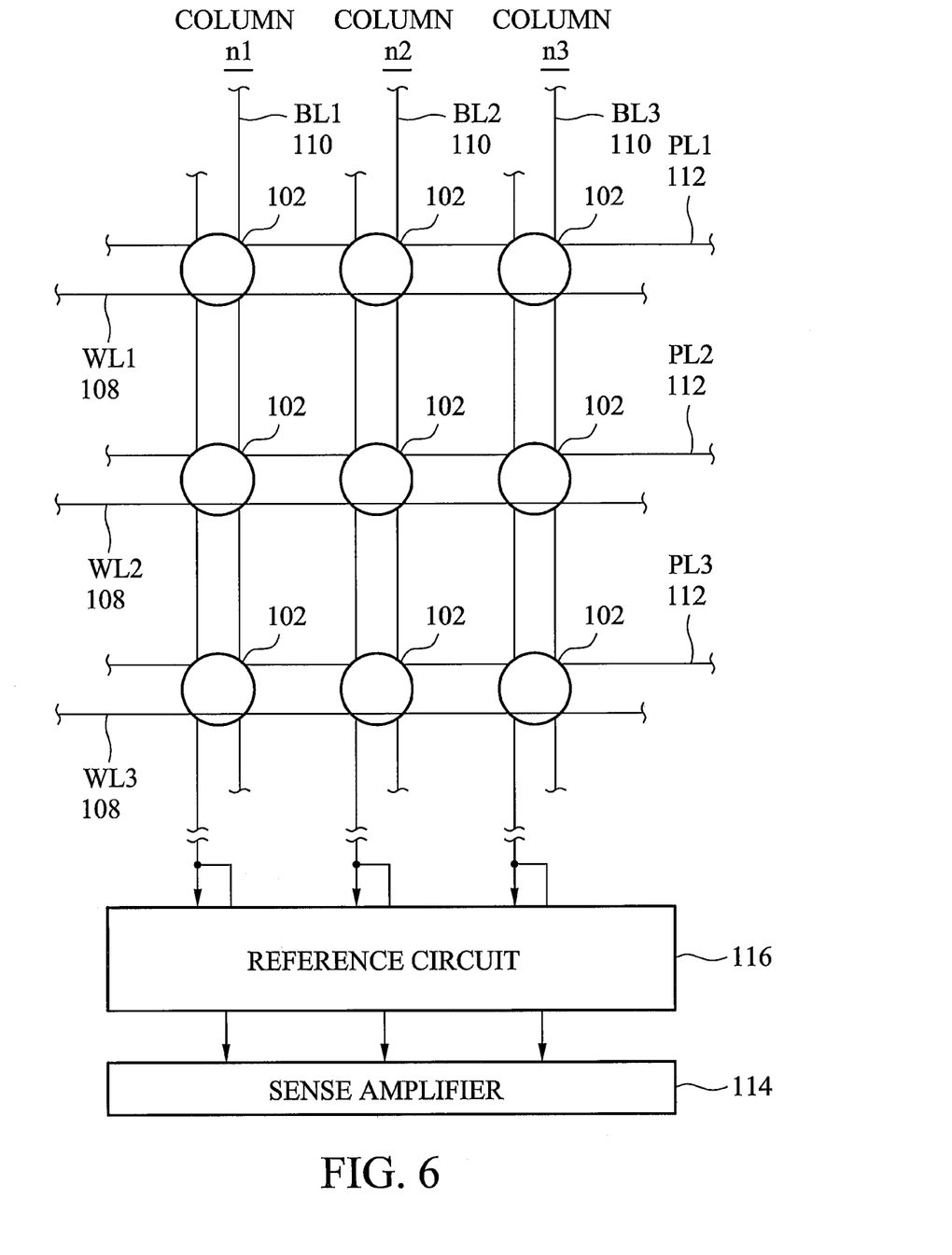
FIG. 6 shows a simplified plan view of a layout of a portion of an MRAM array.

The reference circuit 116 includes a reference resistance and a serves as a reference structure for read operations such as those described below. FIG. 5 shows a schematic diagram of an embodiment of the reference circuit 116. The reference circuit 116 includes a series of column-select transistors 118 and reference transistors 120. Reference will now also be made to FIG. 6, which shows an example of how the reference circuit 116 and sense amplifier 114 can be coupled to the memory array 100. A drain node of each column-select transistor 118 is coupled to a respective column of the memory array 100. The gate nodes of the colunm-select transistors 118 are coupled to respective control signals for their associated columns. Thus, when a particular column is selected for a read operation, the column-select transistor 118 associated with the particular column is turned on. In this way, the column selector can control, at least in part, the resistance imposed by the reference circuit 116. The reference circuit 116 can, optionally, also include a series of reference transistors 120, where a drain of each reference transistor 120 is coupled to a source node of a respective column-select transistor 118. Thus, each column of memory cells 102 of the memory array 100 is connected to a respective column-select transistor 118 and reference transistor 120. The gates of the reference transistors 120 are connected to receive a resistance-control voltage $V_{RC}$ that can be adjusted to control the amount of resistance imposed by the reference transistors 120. The source nodes of the reference transistors 120 can be connected to signal ground VSS or to a predetermined voltage level VDD depending on the method used for reading the memory cell 102.

There are several different methods of reading the memory cell 102 that can be employed for the portion of the MRAM array 100 shown in FIGS. 4 and 5.

A first method of reading the memory cell 102 can be used when the reference transistor 120 has its source node connected to signal ground $V_{SS}$. In order to read the data bit stored in the MR element 104, the WL 108 is set to a voltage suitable for turning on the pass transistor 106. The BL 110 is set to a predetermined voltage, for example a voltage in a range of 0.3V to 1.5V. The PL 112 is not used for a read operation. The voltage $V_{IN}$ at input node 117 will depend on the resistance of the MR element 104 as follows:

$$V_{IN} = V_{BL} \frac{R_{REF}}{R_{REF} + R_{MR}} \qquad (1)$$

where $R_{REF}$ is the resistance across the column-select transistor 118 and the reference transistor 120 and $R_{MR}$ is the resistance across the MR element 104. The voltage level $V_{IN}$ can then be detected by the sense amplifier 114 in order to detect the logic state stored in the memory cell 102. For example, in embodiments that include a reference cell (not shown), the sense amplifier 114 can detect the logic state of the memory cell 102 based on a comparison of the voltage level $V_{IN}$ to a reference voltage received from the reference cell.

In some embodiments, the above-described reading method can include varying the voltage level supplied to the BL 110 during a read operation. For example, a read cycle can include applying a first voltage level $V_{CC}$ to the BL 110 for a first period of time, then applying a second voltage level $V_{DD}$ to the BL 110 for a second period of time. In some embodiments, the second voltage level $V_{DD}$ can be larger than the first voltage level $V_{CC}$, for example $V_{DD}$ can be twice the voltage of $V_{CC}$. For such a read operation, voltage sensing by the sense amplifier 114 can be performed for all voltage levels applied to the BL 110 or far a select number of the voltage levels. For example, sensing can be performed for only the highest voltage level or for all voltage levels applied to the BL 110.

A second method of reading the memory cell 102 can have the BL 110 set to signal ground $V_{SS}$ and the source node of the reference transistor 120 connected to a predetermined voltage $V_{DD}$ for example a voltage in a range of 0.3V to 1.5V. The WL 108 is still set to a voltage suitable for turning on the pass transistor 106. The PL 112 is not used for this read operation. As in the first read scheme, the voltage $V_{IN}$ at input node 117 will depend on the resistance of the MR element 104 according to Equation (1) above. The voltage $V_{IN}$ can then be detected by the sense amplifier 114 in order to detect the logic state stored in the memory cell 102.

In some embodiments, the above-described reading method can include varying the voltage level supplied to the source node of the reference transistor 120 during a read operation. For example, a read cycle can include applying a first voltage level $V_{CC}$ to the source node of the reference transistor 120 for a first period of time, then applying a second voltage level $V_{DD}$ to the source node of the reference transistor 120 for a second period of time. In some embodiments, the second voltage level $V_{DD}$ can be larger than the first voltage level $V_{CC}$, for example $V_{DD}$ can be twice the voltage of $V_{CC}$. For such a read operation, voltage sensing by the sense amplifier 114 can be performed for all voltage levels applied to the source node of the reference transistor 120 or for a select number of the voltage levels. For example, sensing can be performed for only the highest voltage level or for all voltage levels applied to the source node of the reference transistor 120.

As a result of including the reference circuit 116 for reading the memory cell 102, the amount of voltage applied to the bit line BL 110 can be increased, for example twice the voltage used for a comparable memory cell in a prior MRAM array. The use of a higher read voltages allows for faster read times compared to prior MRAM arrays such as the one shown in FIG. 1.

A write operation can be performed by passing sufficiently high currents through the PL 112 and the BL 110. The magnitude of these currents is selected such that, ideally, the resulting magnetic fields are not strong enough on their own to affect the memory state of the MR element 104 (or other MR elements not shown), but the combination of the two magnetic fields (at MR element 104) is sufficient for switching the memory state (e.g., switching the magnetic moment of the free layer 53) of the MR element 104. During a write operation, the WL 108 is set to signal ground $V_{SS}$.

Figure 7:
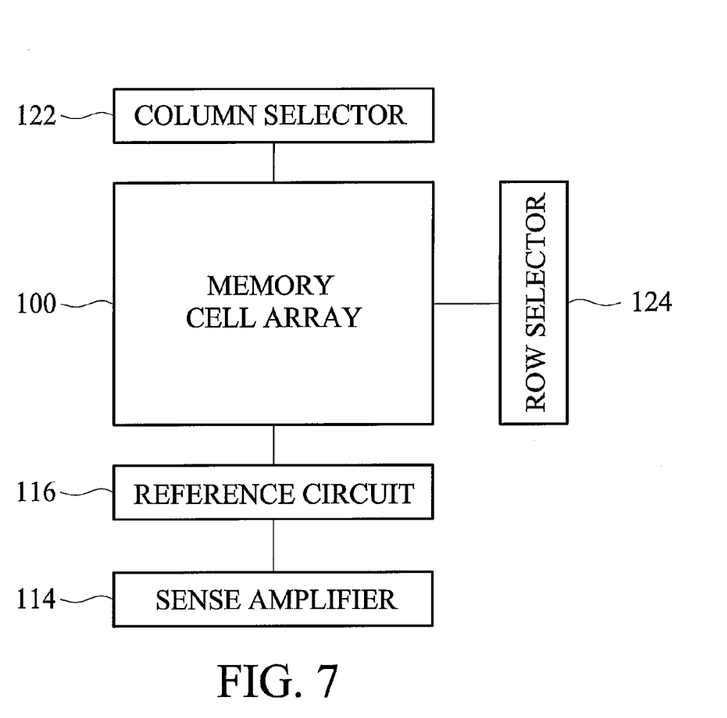
FIG. 7 shows a simplified block diagram of an example of an arrangement for an MRAM device.
Figure 8:
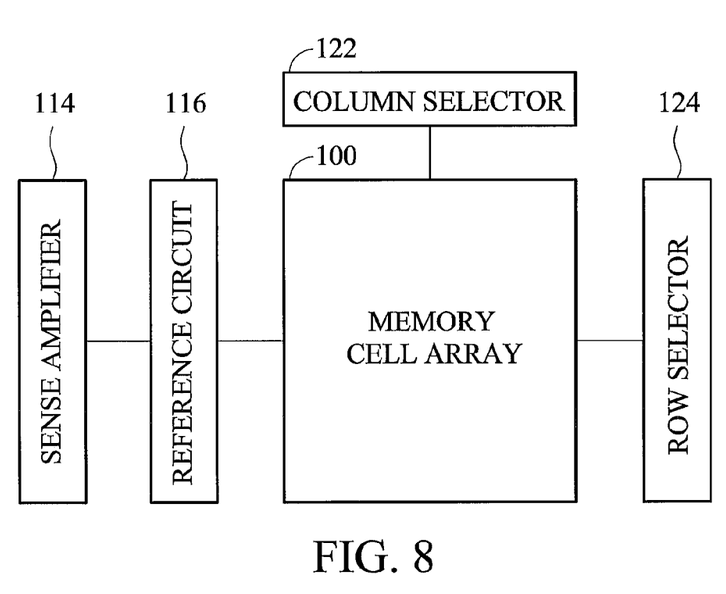
FIG. 8 shows a simplified block diagram of another example of an arrangement for an MRAM device.

FIGS. 7 and 8 show simplified block diagrams of examples of arrangements that can be used for an MRAM device having an MRAM array 100. In the example shown in FIG. 7, the reference circuit 116 and sense amplifier 114 are positioned on an opposite side of the MRAM array 100 from the column selector 122. In this case, the bit lines BL 110, word lines WL 108, program lines PL 112, and sense lines 115 could be arranged as shown in FIG. 6. Specifically, the sense lines 115 can be arranged to extend somewhat parallel to the extending direction of the bit lines BL 110, while the program lines PL 112 and word lines WL 108 can be arranged to extend somewhat orthogonal to the extending directing of the bit lines BL 110. In the example shown in FIG. 8, the bit lines BL 110, word lines WL 108, and program lines PL 112 can be arranged as shown in FIG. 6, but the sense lines 115 are arranged to extend somewhat parallel to the program lines PL 112 and word lines WL 108.

As a result, the sense amplifier 114 and reference circuit 116 can be positioned on an opposite side of the MRAM array 100 from the row selector 124. FIGS. 7 and 8 are only examples of the many possible arrangements of components of an MRAM device that includes an MRAM array 100. Additional circuits and/or alternate arrangements of conductive lines and/or circuits can be used.

While various embodiments in accordance with the principles disclosed herein have been described above, it should be understood that the have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and elements accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An MRAM device comprising:
   a memory cell including a magnetoresistive element and a pass transistor having a source node;
   an input node connected to the source node of the pass transistor;
   a reference structure connected to the input node and having a reference resistance the reference structure comprising:
      a reference transistor having a drain node connected to the source node of the pass transistor, and a source node connected to a predetermined voltage, and
      a first transistor connected between the source node of the reference transistor and the predetermined voltage; and
   a sensing device for sensing the voltage at the input node derived at least in part based on the reference resistance.

2. An MRAM device according to claim 1, further comprising a column selector, wherein the reference resistance of the reference structure is controlled by the column selector.

3. An MRAM device according to claim 1, wherein the reference structure includes a first node connected to the source node of the pass transistor and includes a second node connected to a predetermined voltage.

4. An MRAM device according to claim 3, wherein the predetermined voltage is signal ground.

5. An MRAM device according to claim 1, wherein the memory cell includes:
a first conductive layer extending in a first direction and connected to the magnetoresistive element;
a second conductive layer extending in a second direction;
a dielectric layer separating the second conductive layer and the magnetoresistive element; and
a third conductive layer,
wherein the pass transistor includes a gate node connected to the third conductive layer.

6. An MRAM device according to claim 5, wherein the first conductive layer is a bit line.

7. An MRAM device according to claim 5, wherein the second conductive layer is a program line.

8. An MRAM device according to claim 5, wherein the third conductive layer is a word line.

9. An MRAM device according to claim 5, wherein the third conductive layer extends in the second direction.

10. An MRAM device comprising:
a first conductive layer extending in a first direction;
a second conductive layer extending in a second direction;
a magnetoresistive element connected to the first conductive layer;
a third conductive layer;
a first transistor having a source node, a drain node connected to the magnetoresistive element, and a gate node connected to the third conductive layer;
a reference structure connected to the source node of the first transistor and having a reference resistance; and
a sensing device connected to the source node of the first transistor for sensing the voltage at the source node derived at least in part based on the reference resistance.

11. An MRAM device according to claim 10, wherein the third conductive layer extends in the second direction.

12. An MRAM device according to claim 10, wherein the first direction is orthogonal to the second direction.

13. An MRAM device according to claim 10, wherein the magnetoresistive element includes a first electrode layer that is electrically connected to the drain node of the first transistor.

14. An MRAM device according to claim 13, wherein the magnetoresistive element includes a second electrode layer that is electrically connected to the first conductive layer.

15. An MRAM device according to claim 10, wherein the reference structure comprises a second transistor having a drain node connected to the source node of the first transistor, and a source node connected to a predetermined voltage.

16. An MRAM device according to claim 15, wherein the reference structure further comprises a third transistor connected between the source node of the second transistor and the predetermined voltage, and having a gate connected to an adjustable control voltage.

17. An MRAM device according to claim 10, wherein the reference structure includes a resistance, the MRAM device further comprising a column selector, wherein the resistance of the reference structure is controlled by the column selector.

18. An MRAM device according to claim 17, wherein the column selector comprises a transistor.

* * * * *